(12) United States Patent
Grover et al.

(10) Patent No.: US 12,261,231 B2
(45) Date of Patent: Mar. 25, 2025

(54) THIN FILM STACKS FOR GROUP V DOPING, PHOTOVOLTAIC DEVICES INCLUDING THE SAME, AND METHODS FOR FORMING PHOTOVOLTAIC DEVICES WITH THIN FILM STACKS

(71) Applicant: First Solar, Inc., Tempe, AZ (US)

(72) Inventors: Sachit Grover, Campbell, CA (US); Chungho Lee, San Jose, CA (US); Xiaoping Li, San Jose, CA (US); Dingyuan Lu, San Jose, CA (US); Roger Malik, Santa Clara, CA (US); Gang Xiong, Santa Clara, CA (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 17/751,189

(22) Filed: May 23, 2022

(65) Prior Publication Data

US 2022/0285569 A1 Sep. 8, 2022

Related U.S. Application Data

(63) Continuation of application No. 16/488,808, filed as application No. PCT/US2018/019848 on Feb. 27, 2018, now Pat. No. 11,342,471.

(Continued)

(51) Int. Cl.
*H01L 31/0296* (2006.01)
*H01L 31/0304* (2006.01)
(Continued)

(52) U.S. Cl.
CPC .. *H01L 31/02963* (2013.01); *H01L 31/03044* (2013.01); *H01L 31/0516* (2013.01);
(Continued)

(58) Field of Classification Search
CPC ......... H01L 31/0296–02966; H01L 31/03044; H01L 31/0516
See application file for complete search history.

(56) References Cited

U.S. PATENT DOCUMENTS 8,748,214 B2   6/2014   DeLuca et al.
8,990,208 B2   3/2015   Wang et al.
(Continued)

FOREIGN PATENT DOCUMENTS

CN   103946987 A   7/2014
CN   104221165 A   12/2014
(Continued)

OTHER PUBLICATIONS

Definition of buffer and window layers "https://www.teknik.uu.se/solid-state-electronics+/research-areas/solar-cells/Projects/window-layer-structures/" (Year: 2017).*

(Continued)

*Primary Examiner* — Andrew J Golden
(74) *Attorney, Agent, or Firm* — MacMillan, Sobanski & Todd, LLC (57) ABSTRACT

According to the embodiments provided herein, a method for forming a photovoltaic device can include depositing a plurality of semiconductor layers. The plurality of semiconductor layers can include a doped layer that is doped with a group V dopant. The doped layer can include cadmium selenide or cadmium telluride. The method can include annealing the plurality of semiconductor layers to form an absorber layer.

20 Claims, 3 Drawing Sheets

Related U.S. Application Data (60) Provisional application No. 62/464,127, filed on Feb. 27, 2017.

(51) Int. Cl.
 *H01L 31/05* (2014.01)
 *H01L 31/18* (2006.01)

(52) U.S. Cl.
 CPC .......... *H01L 31/18* (2013.01); *H01L 31/1828* (2013.01); *H01L 31/1864* (2013.01)

(56) References Cited

U.S. PATENT DOCUMENTS

| | | | |
|---|---|---|---|
| 9,105,802 | B2 | 8/2015 | Cao et al. |
| 9,263,608 | B2 | 2/2016 | Powell et al. |
| 10,319,873 | B2 | 6/2019 | Powell et al. |
| 10,861,994 | B2 | 12/2020 | Abken et al. |
| 11,158,749 | B2 | 10/2021 | Grover et al. |
| 11,201,257 | B2 | 12/2021 | Grover et al. |
| 11,502,212 | B2 | 11/2022 | Cao et al. |
| 2009/0223556 | A1 | 9/2009 | Niesen et al. |
| 2010/0015753 | A1 | 1/2010 | Garnett |
| 2011/0277812 | A1 | 11/2011 | Buller et al. |
| 2012/0305064 | A1* | 12/2012 | Johnson ............ H01L 31/02963 438/57 |
| 2013/0180579 | A1 | 7/2013 | Jin et al. |
| 2014/0216550 | A1* | 8/2014 | Damjanovic ..... H01L 31/02966 136/260 |
| 2014/0246093 | A1* | 9/2014 | Chen ................. H01L 31/02966 136/262 |
| 2014/0261685 | A1* | 9/2014 | Liao .................... H01L 31/0296 136/260 |
| 2014/0261688 | A1* | 9/2014 | Allenic ............. H01L 31/02963 136/260 |
| 2014/0360565 | A1 | 12/2014 | Blaydes et al. |
| 2015/0171260 | A1 | 6/2015 | Liu et al. |
| 2015/0357502 | A1* | 12/2015 | Basol ................ H01L 31/02966 438/94 |
| 2016/0126396 | A1 | 5/2016 | Damjanovic et al. |
| 2021/0091250 | A1 | 3/2021 | Abken et al. |
| 2022/0045225 | A1 | 2/2022 | Grover et al. |

FOREIGN PATENT DOCUMENTS

| | | | |
|---|---|---|---|
| CN | 106098816 A | 11/2016 | |
| EP | 0080342 A2 * | 6/1983 | ............. H01L 31/07 |
| JP | 2012204477 A | 10/2012 | |
| WO | WO-2007129097 A2 * | 11/2007 | ......... H01L 31/0296 |

OTHER PUBLICATIONS

Drayton et al "Properties of RF sputtered ZnTe:N films for back contact to CdS/CdTe solar cells." MRS Online Proceedings Library (OPL) 668 (2001): H5-9 (Year: 2001).*

International Search Report and Written Opinion, Application No. PCT/US2018/019848, dated Jul. 31, 2018.

Colegrove et al., "Arsenic Doped Heteroepitaxial CdTe by MBE for Applications in Thin-Film Photovoltaics", 2014 IEEE 40th Photovoltaic Specialist Conference, IEEE, Jun. 8, 2014, pp. 3261-3265.

Poplawsky et al., "Structural and compositional dependence of the $CdTe_xSe_{1-x}$ alloy layer photoactivity in CdTe-based solar cells", Nature Communications, vol. 7, Jul. 27, 2016, pp. 1-10.

Paudel et al., "Enhancing the photo-currents of CdTe thin-film solar cells in both short and long wavelength regions", Applied Physics Letters, 2014, vol. 105, pp. 183510-1-183510-5.

Vigil-Galan et al., "CdTe:Bi films deposited by closed space vapor transport under variable pressure and doping levels: evidences of the possible formation of an intermediate band", Journal of Materials Science Materials in Electronics, 2016, URL: https://www.researchgate.net/publication/295005819.

Proskuryakov et al., "Doping levels, trap density of states and the performance of co-doped CdTe(As,Cl) photovoltaic devices", Solar Energy Materials & Solar Cells, 2009, pp. 1572-1581.

Colegrove et al., "Phosphorus doping of polycrystalline CdTe by difusion", National Renewable Energy Laboratory, Conference, 2015, URL: https://doi.org/10.1109/PVSC.2015.7356370.

Japanese Office Action, Application No. 2019546912, dated Feb. 7, 2020.

Extended European Search report for European application No. 20174225.1, dated Sep. 7, 2020, pp. 1-7.

Intellectual Property India Examination report under sections 12 & 13 of the Patents Act, 1970 and the Patents Rule, 2003, Application No. 201917037468, dated Jan. 18, 2021.

Japanese Notification of Reasons for Rejection, Application No. 2020-169527, dated Jan. 25, 2022.

Chinese First Office Action and Search Report, National Intellectual Property Administration, P.R. China, Application No. 201880027701.0, dated Jun. 2022.

Japanese Notification of Reasons for Rejection, Application No. 2020-169527, dated Oct. 31, 2022.

Japanese Decision of Dismissal of Amendment, dated Jul. 27, 2023, Application No. 2020-169527.

Japanese Decision of Rejection, dated Jul. 27, 2023, Application No. 2020-169527.

* cited by examiner

THIN FILM STACKS FOR GROUP V DOPING, PHOTOVOLTAIC DEVICES INCLUDING THE SAME, AND METHODS FOR FORMING PHOTOVOLTAIC DEVICES WITH THIN FILM STACKS

CROSS-REFERENCE TO RELATED APPLICATIONS

This application is a continuation application of U.S. patent application Ser. No. 16/488,808, which entered the U.S. national phase on Aug. 26, 2019, from the International Patent Application PCT/US2018/019848, filed on Feb. 27, 2018, and claims the benefit of U.S. Provisional Patent Application 62/464,127, filed on Feb. 27, 2017. Each of the aforementioned applications is incorporated by reference herein in its entirety.

BACKGROUND

The present specification generally relates to the use of p-type dopants in thin film photovoltaic devices and, more specifically, to the use of group V p-type dopants in thin film photovoltaic devices.

A photovoltaic device generates electrical power by converting light into direct current electricity using semiconductor materials that exhibit the photovoltaic effect. Certain types of semiconductor material can be difficult to manufacture. For example, thin film layers provided adjacent to semiconductor material can lead to inoperability or instability of the photovoltaic device. The use of group V elements as a dopant for a p-type semiconductor can be particularly difficult.

Accordingly, a need exists for alternative thin film stacks for use in thin film photovoltaic devices incorporating group V p-type dopants.

SUMMARY

The embodiments provided herein relate to thin-film stacks for use with group V dopants. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Thin film photovoltaic devices can include multiple layers created on a substrate (or superstrate). For example, a photovoltaic device can include a barrier layer, a transparent conductive oxide (TCO) layer, a buffer layer, an absorber layer, and a back contact layer formed in a stack on a substrate. Each layer may in turn include more than one layer or film. For example, absorber layer can be formed from a plurality of semiconductor layers.

Figure 1:
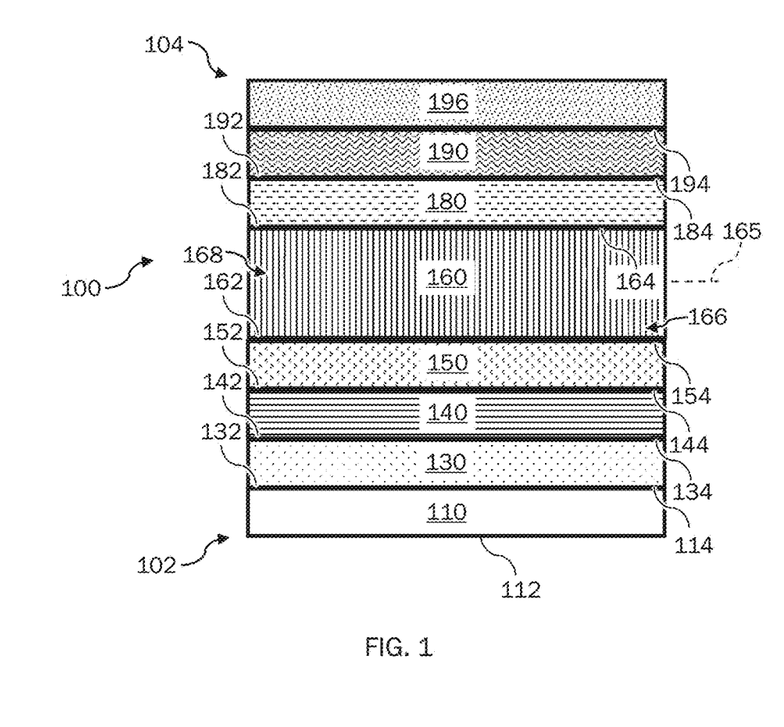
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 102 can also define an opposing side 104 offset from the energy side 102. It is noted that the term "light" can refer to various wavelengths of the electromagnetic spectrum such as, but not limited to, wavelengths in the ultraviolet (UV), infrared (IR), and visible portions of the electromagnetic spectrum. The photovoltaic device 100 can include a plurality of layers disposed between the energy side 102 and the opposing side 104. As used herein, the term "layer" can refer to a thickness of material provided upon a surface. Additionally, each layer can cover all or any portion of the surface.

Figure 2:
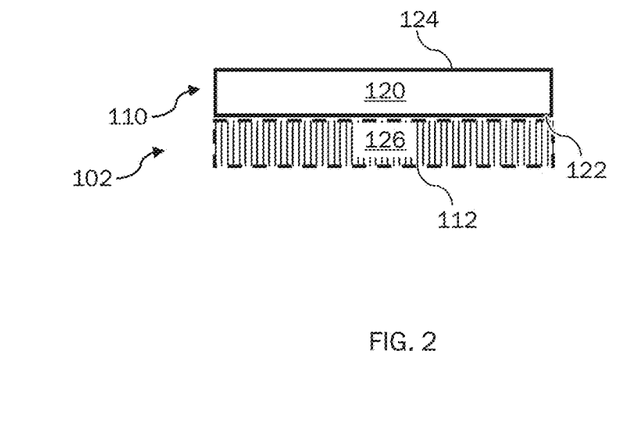
FIG. 2 schematically depicts a substrate according to one or more embodiments shown and described herein.

The photovoltaic device 100 can include a substrate 110 configured to facilitate the transmission of light into the photovoltaic device 100. The substrate 110 can be disposed at the energy side 102 of the photovoltaic device 100. Referring collectively to FIGS. 1 and 2, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

Referring collectively to FIGS. 1 and 2, the substrate 110 can include a transparent layer 120 having a first surface 122 substantially facing the energy side 102 of the photovoltaic device 100 and a second surface 124 substantially facing the opposing side 104 of the photovoltaic device 100. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to the light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 500 Å in one embodiment, more than about 750 Å in another embodiment, or less than about 1200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the barrier layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 150 may include material having higher resistivity than the TCO layer 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or a combination thereof. Generally, the material of the buffer layer 150 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

The photovoltaic device 100 can include an absorber layer 160 configured to form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 2 μm to about 5 μm in another embodiment. The absorber layer 160 can further include a midpoint 165 located in the middle of the thickness of the absorber layer 160, i.e., located at the 50% location between the first surface 162 and the second surface 164 of the absorber layer 160.

Referring still to FIG. 1, the absorber layer 160 can be formed from a p-type semiconductor material having an excess of positive charge carriers, i.e., holes. The absorber layer 160 can include any suitable p-type semiconductor material, including, for example, semi-conductor materials formed from cadmium, tellurium, selenium, sulfur, or any combination thereof. Specific examples include, but are not limited to, cadmium telluride, ternaries of cadmium, selenium and tellurium (e.g., $CdSe_xTe_{1-x}$), ternaries of cadmium, sulfur, and tellurium (e.g., $CdS_xTe_{1-x}$), quaternaries of cadmium, selenium, sulfur, and tellurium, or their equivalent. In embodiments where the absorber layer 160 comprises selenium and cadmium, the atomic percent of the selenium can be greater than about 0 atomic percent and less than about 20 atomic compared to cadmium. It is noted that the atomic percent described herein is representative of the entirety of the absorber layer 160, the atomic percentage of material at a particular location within the absorber layer 160 can vary with thickness compared to the overall composition of the absorber layer 160. In embodiments where the absorber layer 160 comprises sulfur and cadmium, the atomic percent of the sulfur can be greater than about 0 atomic percent and less than about 20 atomic compared to cadmium. It is noted that the concentration of tellurium can vary through the thickness of the absorber layer 160. For example, when the absorber layer 160 comprises a ternary of cadmium, selenium, and tellurium ($CdSe_xTe_{1-x}$), x can vary in the absorber layer 160 with distance from the first surface 162 of the absorber layer 160. Similarly, when the absorber layer 160 comprises a ternary of cadmium, sulfur, and tellurium ($CdS_xTe_{1-x}$), x can vary in the absorber layer 160 with distance from the first surface 162 of the absorber layer 160.

According to the embodiments provided herein, the absorber layer 160 can be doped with a dopant configured to manipulate the charge carrier concentration. In some embodiments, the absorber layer can be doped with a group V dopant such as, for example, arsenic, phosphorous, antimony, or a combination thereof. The total dosage of the group V dopant within the absorber layer 160 can be controlled. In some embodiments, the total dosage of the group V dopant in the absorber layer 160 is greater than about 0 atomic % and less than about atomic 0.1%, such as, for example, greater than about 0.001 atomic % and less than about 0.05 atomic % in one embodiment. Alternatively or additionally, the percent concentration profile of the group V dopant through the thickness of the absorber layer 160. Specifically, the amount of the group V dopant can vary with distance from the first surface 162 of the absorber layer 160. Furthermore, the concentration of oxygen in the absorber layer 160 can be controlled. Specifically, an average concentration of oxygen in the absorber layer 160, measured between the first surface 162 of the absorber layer 160 and the midpoint 165 of the absorber layer 160, can be less or equal to about $3\times10^{17}$ cm$^{-3}$ such as, for example, less than or equal to about $2\times10^{17}$ cm$^{-3}$ in one embodiment, between about $5\times10^{15}$ cm$^{-3}$ and about $3\times10^{17}$ cm$^{-3}$ in another embodiment, or between about $5\times10^{15}$ cm$^{-3}$ and about $2\times10^{17}$ cm$^{-3}$ in a further embodiment. It is noted that the average concentration of oxygen was determined using Time-of-Flight Secondary Ion Mass Spectrometry (TOF-SIMS).

In some embodiments, the absorber layer 160 can include absorber buffer interface region 166 formed adjacent to the first surface 162 of the absorber layer 160, and a bulk portion 168 from adjacent to the absorber buffer interface region 166, i.e., between the absorber buffer interface region 166 and the second surface 164 of the absorber layer 160. For example, the absorber buffer interface region 166 can span the first 10% of the thickness of the absorber layer 160 from the first surface 162 and the bulk portion 168 can span the remainder of the thickness of the absorber layer 160. In embodiments where the group V dopant comprises arsenic, the percent concentration profile of arsenic in the absorber buffer interface region 166 can differ from the percent concentration profile of arsenic in the bulk portion 168.

Referring still to FIG. 1, the p-n junction can be formed by providing the absorber layer 160 sufficiently close to a portion of the photovoltaic device 100 having an excess of negative charge carriers, i.e., electrons. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Figure 3:
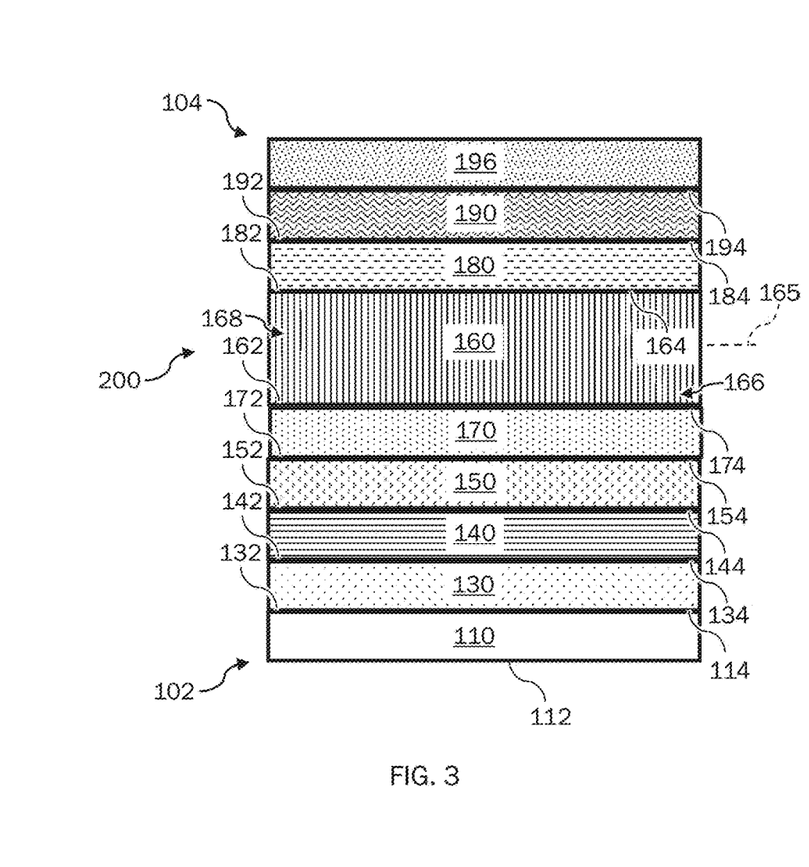
FIG. 3 schematically depicts a photovoltaic device according to one or more embodiments shown and described herein.

Referring now to FIG. 3, in some embodiments, a photovoltaic device 200 can include a window layer 170 comprising n-type semiconductor material. The absorber layer 160 can be formed adjacent to the window layer 170. The window layer 170 can have a first surface 172 substantially facing the energy side 102 of the photovoltaic device 100 and a second surface 174 substantially facing the opposing side 104 of the photovoltaic device 100. In some embodiments, the window layer 170 can be positioned between the absorber layer 160 and the TCO layer 140. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof.

Referring collectively to FIGS. 1 and 3, the photovoltaic device 100 can include a back contact layer 180 configured to mitigate undesired alteration of the group V dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can be substantially copper free, i.e., can be formed from materials that do not include copper. Without being bound to theory, it is believed that copper can interfere with group V dopants (e.g., arsenic). Specifically, the back contact layer 180 can include any suitable material such as, for example, nitrogen-doped zinc telluride (ZnTe), or the like.

The photovoltaic device 100 can include a conducting layer 190 configured to provide electrical contact with the absorber layer 160. The back conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, molybdenum nitride (MoN$_x$) doped with aluminum, molybdenum, or the like.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conducting layer 190. The back support 196 can include any suitable material, including, for example, glass (e.g., soda-lime glass).

Figure 4:
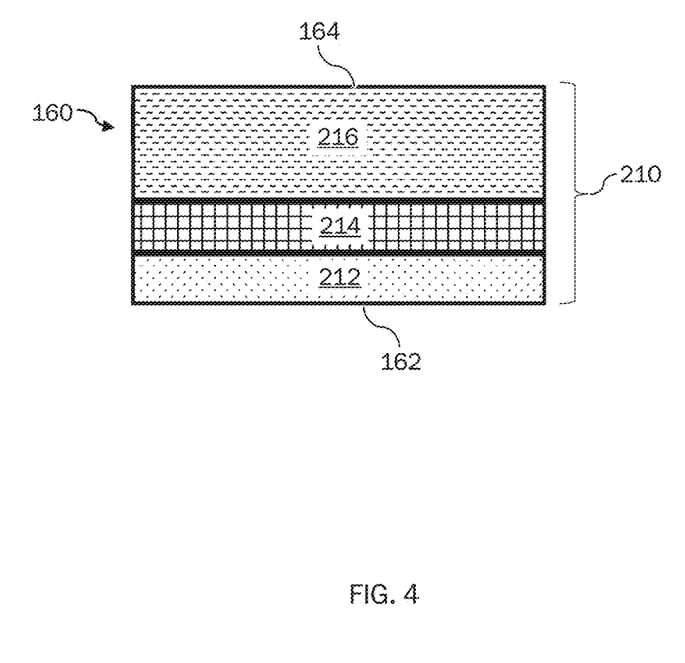
FIGS. 4 and 5 schematically depict film stacks for forming absorber layers of photovoltaic devices according to one or more embodiments shown and described herein.
Figure 5:
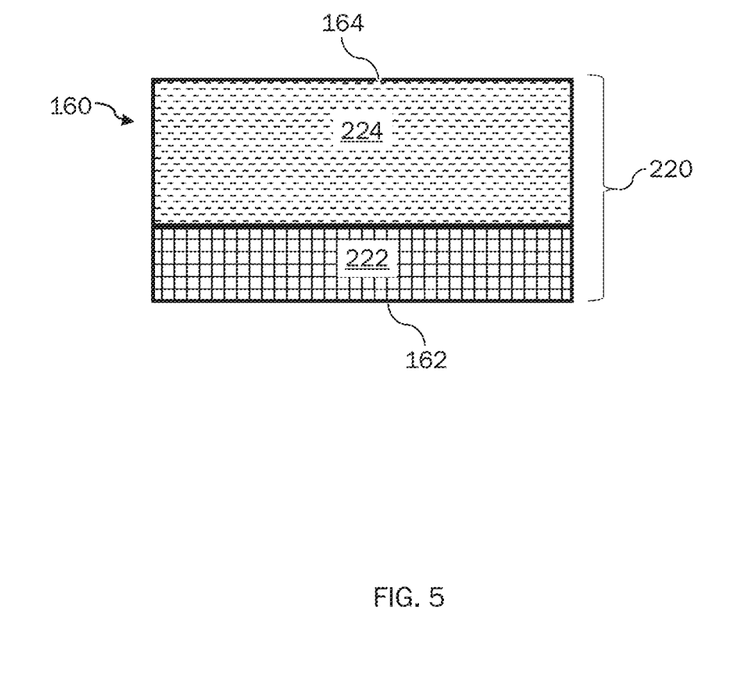

Referring collectively to FIGS. 4 and 5, the absorber layer 160 can be formed from a plurality of semiconductor layers 210. For example, the semiconductor layers 210 can be provided as a stack of thin films deposited upon one another using any known deposition technique, including vapor transport deposition. Each of the semiconductor layers 210 can include any suitable p-type semiconductor material, including, for example, semiconductor materials formed from cadmium, tellurium, selenium, sulfur, or any combination thereof. In some embodiments, the material composition of the semiconductor layers 210 can vary. After deposition, the semiconductor layers 210 can be annealed, which can cause the semiconductor layers 210 to diffuse into one another to form a blended material composition having the characteristics described above with respect to the absorber layer 160. In some embodiments, one or more of the semiconductor layers 210 can be provided as a doped layer, i.e., doped with a group V dopant as described herein. In further embodiments, a majority of the absorber layer 160 can be formed from the doped layer, i.e., the doped layer can be the thickest of the semiconductor layers 210.

With reference to FIG. 4, in some embodiments, the semiconductor layers 210 can comprise a first semiconductor layer 212, a second semiconductor layer 214, and a third semiconductor layer 216. The first semiconductor layer 212 can be the layer nearest to the first surface 162 of the absorber layer 160. The third semiconductor layer 216 can be the layer nearest to the second surface 164 of the absorber layer 160. The second semiconductor layer 214 can be positioned between the first semiconductor layer 212 and the third semiconductor layer 216. In one embodiment, the first semiconductor layer 212 can comprise cadmium selenide (CdSe), the second semiconductor layer 214 can comprise cadmium telluride (CdTe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212. For example, a ratio of the thickness of the third semiconductor layer 216 to the first semiconductor layer 212 can be greater than about 4 such as, for example, greater than about 6 in one embodiment, or greater than about 8 in another embodiment. A ratio of the thickness of the second semiconductor layer 214 to the first semiconductor layer 212 can be greater than about 1.1 and less than about 10 such as, for example, greater than about 1.25 and less than about 5 in one embodiment.

In another embodiment, the first semiconductor layer 212 can comprise cadmium telluride (CdTe), the second semiconductor layer 214 can comprise cadmium selenide (CdSe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212.

In yet another embodiment, the first semiconductor layer 212 can comprise a ternary of cadmium, selenium and tellurium (e.g., $CdSe_xTe_{1-x}$), the second semiconductor layer 214 can comprise cadmium telluride (CdTe), and the third semiconductor layer 216 can comprise cadmium telluride (CdTe) doped with arsenic. The third semiconductor layer 216 can be the thickest layer, and the first semiconductor layer 212 can be thicker than the second semiconductor layer 214.

In a further embodiment, the first semiconductor layer 212 can comprise cadmium sulfide (CdS), the second semiconductor layer 214 can comprise cadmium telluride (CdTe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212.

Referring still to FIG. 4, in some embodiments, the first semiconductor layer 212 can comprise cadmium telluride (CdTe), the second semiconductor layer 214 can comprise cadmium selenide (CdSe) doped with arsenic, and the third semiconductor layer 216 can comprise cadmium telluride (CdTe). Alternatively, the third semiconductor layer 216 can comprise cadmium telluride (CdTe) doped with arsenic. The third semiconductor layer 216 can be the thickest layer, and the second semiconductor layer 214 can be thicker than the first semiconductor layer 212. For example, a ratio of the thickness of the third semiconductor layer 216 to the first semiconductor layer 212 can be greater than about 10 such as, for example, greater than about 20 in one embodiment, or greater than about 25 in another embodiment. A ratio of the thickness of the second semiconductor layer 214 to the first semiconductor layer 212 can be greater than about 1.1 and less than about 10 such as, for example, greater than about 1.25 and less than about 5 in one embodiment.

According to the embodiments provided herein, the first semiconductor layer 212 can comprise cadmium telluride (CdTe), the second semiconductor layer 214 can comprise cadmium selenide (CdSe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212. For example, a ratio of the thickness of the third semiconductor layer 216 to the first semiconductor layer 212 can be greater than about 10, and a ratio of the thickness of the second semiconductor layer 214 to the first semiconductor layer 212 can be greater than about 1.1 and less than about 10.

With reference to FIG. 5, in some embodiments, the semiconductor layers 220 can comprise a first semiconductor layer 222, and a second semiconductor layer 224. The first semiconductor layer 222 can be the layer nearest to the first surface 162 of the absorber layer 160. The second semiconductor layer 224 can be the layer nearest to the second surface 164 of the absorber layer 160. In one embodiment, the first semiconductor layer 222 can comprise cadmium selenide (CdSe) doped with arsenic, and the second semiconductor layer 224 can comprise cadmium telluride (CdTe) doped with arsenic. The second semiconductor layer 224 can be thicker than the first semiconductor layer 222. For example, a ratio of the thickness of the second semiconductor layer 224 to the first semiconductor layer 222 can be greater than about 6 such as, for example, greater than about 8 in one embodiment, or greater than about 10 in another embodiment.

In another embodiment, the first semiconductor layer 222 can comprise cadmium selenide (CdSe), and the second semiconductor layer 224 can comprise cadmium telluride (CdTe) doped with arsenic. The second semiconductor layer 224 can be thicker than the first semiconductor layer 222. For example, a ratio of the thickness of the second semiconductor layer 224 to the first semiconductor layer 222 can be greater than about 7 such as, for example, greater than about 9 in one embodiment, or greater than about 10 in another embodiment.

It should now be understood that the embodiments described herein relate to thin film photovoltaic devices and thin film stacks for use with photovoltaic devices that facilitate the use of group V dopants within p-type semiconductor materials. The described film stacks can provide for operational group V doped p-type CdTe solar devices. Moreover, the back contacts described herein can be provided with copper free material to improve the stability of the dopants.

According to the embodiments provided herein, a method for forming a photovoltaic device can include depositing a plurality of semiconductor layers. The plurality of semiconductor layers can include a doped layer that is doped with a group V dopant. The doped layer can include cadmium selenide or cadmium telluride. The method can include annealing the plurality of semiconductor layers to form an absorber layer. The absorber layer can include cadmium, selenium, and tellurium. A total dosage of the group V dopant in the absorber layer can be greater than 0 atomic % and less than 0.1 atomic %.

In a further embodiment, a photovoltaic device can include an absorber layer and a back contact layer. The absorber layer can have a first surface facing an energy side of the photovoltaic device and a second surface facing an opposing side of the photovoltaic device. The absorber layer can include cadmium and tellurium. The absorber layer can be doped with a group V dopant. The back contact layer can be provided upon the second surface of the absorber layer. The back contact layer can include nitrogen-doped zinc telluride.

In another embodiment, a photovoltaic device can include an absorber layer and a back contact layer. The absorber layer can have a first surface facing an energy side of the photovoltaic device and a second surface facing an opposing side of the photovoltaic device. The absorber layer can include cadmium and tellurium. The absorber layer can be doped with a group V dopant. The back contact layer can be provided upon the second surface of the absorber layer. The back contact layer can be substantially free of copper.

In yet another embodiment, photovoltaic device can include a buffer layer and an absorber layer. The buffer layer can have a first surface facing an energy side of the photovoltaic device and a second surface facing an opposing side of the photovoltaic device. The absorber layer can be provided upon the second surface of the buffer layer. The absorber layer can be formed from a plurality of semiconductor layers. The plurality of semiconductor layers can include a doped layer comprising cadmium and tellurium. The doped layer can be doped with a group V dopant.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A photovoltaic device comprising:
    a buffer layer having a first surface facing an energy side of the photovoltaic device and a second surface facing an opposing side of the photovoltaic device; and
    an absorber layer provided upon the second surface of the buffer layer, wherein:
        the buffer layer comprises at least one of: intrinsic tin dioxide, zinc magnesium oxide, silicon dioxide, aluminum oxide, or aluminum nitride,
        the absorber layer is adjacent to the buffer layer at the second surface of the buffer layer,
        the absorber layer comprises cadmium, selenium, and tellurium,
        the absorber layer is p-type,
        the absorber layer is formed from a plurality of semiconductor layers,
        the plurality of semiconductor layers comprises a doped layer comprising cadmium selenide or cadmium telluride,
        the doped layer is doped with a group V dopant,
        a total dosage of the group V dopant in the absorber layer is greater than 0 atomic percent and less than 0.1 atomic percent, and
        the absorber layer has a first surface nearest the energy side of the photovoltaic device, and an average concentration of oxygen in the absorber layer measured between a first surface of the absorber layer and a midpoint of the absorber layer is between $5 \times 10^{15}$ cm$^{-3}$ and $3 \times 10^{17}$ cm$^{-3}$.

2. The photovoltaic device of claim 1, comprising a back contact layer formed upon the absorber layer, wherein the back contact layer is substantially free of copper.

3. The photovoltaic device of claim 2, wherein the back contact layer comprises nitrogen-doped zinc telluride.

4. The photovoltaic device of claim 2, comprising a conducting layer formed over the back contact layer.

5. The photovoltaic device of claim 1, wherein the plurality of semiconductor layers are deposited over the buffer layer, and the first surface of the absorber layer is provided upon the second surface of the buffer layer.

6. The photovoltaic device of claim 5, wherein:
    an absorber buffer interface region is formed adjacent to the first surface of the absorber layer;
    a percent concentration profile of the Group V dopant is formed in the absorber layer with distance from the first surface of the absorber layer;
    the percent concentration profile of the Group V dopant at the absorber buffer interface differs from the percent concentration profile of the Group V dopant in a bulk portion of the absorber layer; and
    the Group V dopant comprises arsenic.

7. The photovoltaic device of claim 1, wherein the buffer layer consists essentially of: intrinsic tin dioxide, zinc magnesium oxide, silicon dioxide, aluminum oxide, aluminum nitride, or a combination thereof.

8. The photovoltaic device of claim 1, wherein the group V dopant comprises arsenic, phosphorous, antimony, or a combination thereof.

9. The photovoltaic device of claim 1, wherein the absorber layer comprises a ternary of cadmium, selenium, and tellurium.

10. The photovoltaic device of claim 1, wherein the absorber layer comprises a ternary or quaternary of cadmium, selenium, and tellurium.

11. The photovoltaic device of claim 1, wherein the group V dopant is arsenic, and the total dosage of the group V dopant in the absorber layer is greater than 0.001 atomic percent and less than 0.05 atomic percent.

12. A photovoltaic device comprising:
    an absorber layer having a first surface facing an energy side of the photovoltaic device and a second surface facing an opposing side of the photovoltaic device, wherein:
        the absorber layer comprises cadmium, tellurium, and selenium,
        the absorber layer is doped with a group V dopant, and
        a total dosage of the group V dopant in the absorber layer is greater than 0.001 atomic percent and less than 0.05 atomic percent, and
    a back contact layer provided upon the second surface of the absorber layer, wherein the back contact layer is substantially free of copper.

13. The photovoltaic device of claim 12, wherein the back contact layer comprises nitrogen-doped zinc telluride.

14. The photovoltaic device of claim 12, wherein the group V dopant is arsenic.

15. The photovoltaic device of claim 12, wherein the group V dopant is phosphorous.

16. The photovoltaic device of any of claim 12, wherein the group V dopant is antimony.

17. The photovoltaic device of claim 12, further comprising a buffer layer, wherein:
    the first surface of the absorber layer is provided upon a second surface of the buffer layer, whereby the absorber layer is adjacent to the buffer layer;
    the buffer layer comprises at least one of: intrinsic tin dioxide, zinc magnesium oxide, silicon dioxide, aluminum oxide, or aluminum nitride;
    an absorber buffer interface region is formed adjacent to the first surface of the absorber layer;
    the group V dopant comprises arsenic;
    a percent concentration profile of arsenic is formed in the absorber layer with distance from the first surface of the absorber layer; and
    the percent concentration profile of arsenic at the absorber buffer interface differs from the percent concentration profile of arsenic in a bulk portion of the absorber layer.

18. The photovoltaic device of claim 17, wherein the buffer layer consists essentially of: intrinsic tin dioxide, zinc magnesium oxide, silicon dioxide, aluminum oxide, or aluminum nitride.

19. The photovoltaic device of claim 12, wherein the absorber layer comprises a ternary of cadmium, selenium, and tellurium given by the formula $CdSe_xTe_{1-x}$ and x varies in the absorber layer with distance from the first surface of the absorber layer.

20. A photovoltaic device comprising:
- an absorber layer having a first surface facing an energy side of the photovoltaic device and a second surface facing an opposing side of the photovoltaic device, wherein:
  - the absorber layer comprises cadmium, tellurium, and selenium,
  - the absorber layer comprises greater than 0 atomic percent and less than about 20 atomic percent of selenium compared to cadmium,
  - the absorber layer is doped with arsenic,
  - a total dosage of the arsenic in the absorber layer is greater than 0 atomic percent and less than 0.05 atomic percent, and
  - an average concentration of oxygen in the absorber layer measured between the first surface of the absorber layer and a midpoint of the absorber layer is between $5\times10^{15}$ cm$^{-3}$ and $3\times10^{17}$ cm$^{-3}$, and
- a back contact layer provided upon the second surface of the absorber layer, wherein the back contact layer is substantially free of copper.

* * * * *